United States Patent
Osaga et al.

(10) Patent No.: US 10,964,524 B2
(45) Date of Patent: Mar. 30, 2021

(54) SEMICONDUCTOR MANUFACTURING METHOD FOR CUTTING A WAFER

(71) Applicant: Mitsubishi Electric Corporation, Tokyo (JP)

(72) Inventors: Tsuyoshi Osaga, Tokyo (JP); Yasuo Ata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/466,458

(22) PCT Filed: Apr. 7, 2017

(86) PCT No.: PCT/JP2017/014523
§ 371 (c)(1),
(2) Date: Jun. 4, 2019

(87) PCT Pub. No.: WO2018/185932
PCT Pub. Date: Oct. 11, 2018

(65) Prior Publication Data
US 2020/0075311 A1   Mar. 5, 2020

(51) Int. Cl.
*H01L 21/02* (2006.01)
*H01L 21/683* (2006.01)
*H01L 21/768* (2006.01)

(52) U.S. Cl.
CPC .... *H01L 21/02013* (2013.01); *H01L 21/6836* (2013.01); *H01L 21/76862* (2013.01)

(58) Field of Classification Search
CPC ......... H01L 21/02013; H01L 21/76862; H01L 21/6836; H01L 21/67092; H01L 21/78–786; H01L 21/3043; H01L 2221/67763–67781; H01L 21/304–3043; H01L 21/3046; H01L 21/02021; H01L 21/463; H01L 2221/68327–68336; B28D 5/022–029; B28D 5/04–047; B28D 5/0082–0094; B81C 1/00865–00904; B24B 7/228; B24B 9/065
USPC ........................................................ 438/691
See application file for complete search history.

(56) References Cited

U.S. PATENT DOCUMENTS

2007/0077731 A1*   4/2007   Masuda ............. H01L 21/6835
                                                          438/458

FOREIGN PATENT DOCUMENTS

| JP | H06-275712 A | 9/1994 |
| JP | 5390740 B2 | 1/2014 |
| JP | 2016-157903 A | 9/2016 |

OTHER PUBLICATIONS

International Search Report issued in PCT/JP2017/014523; dated May 30, 2017.
An Office Action mailed by the Japanese Patent Office dated Oct. 8, 2019, which corresponds to Japanese Patent Application No. 2019-511038 and is related to U.S. Appl. No. 16/466,458.

* cited by examiner

*Primary Examiner* — Mohammad M Hoque
(74) *Attorney, Agent, or Firm* — Studebaker & Brackett PC (57) ABSTRACT

A back surface of a wafer is formed with a ring-shaped projecting portion. The wafer is cut with a blade from a side of a front surface of the wafer in a state where the projecting portion of the wafer with a back surface facing upward is supported.

3 Claims, 7 Drawing Sheets

SEMICONDUCTOR MANUFACTURING METHOD FOR CUTTING A WAFER

TECHNICAL FIELD

The present invention relates to a semiconductor manufacturing method using a wafer formed with a ring-shaped projecting portion.

BACKGROUND ART

Thinning of a wafer used in manufacturing of a power semiconductor used for electric power has been advancing. Generally, the thinner the wafer is, the more easily a warp of the wafer occurs. If any warp exists in the wafer, there is a possibility that processing of the wafer cannot be normally performed Patent Document 1 discloses a configuration for reducing a warp of a wafer (hereinafter, also referred to as a "related configuration A"). In the related configuration A, only a region corresponding to a device region in a back surface of the wafer is grinded. Thereby, a recessed portion is formed in the back surface of the wafer, and a ring-shaped reinforcement portion is formed in the back surface of the wafer. Note that it is necessary that the ring-shaped reinforcement portion is cut off from the wafer before dicing processing is performed to the wafer.

PRIOR ART DOCUMENT

Patent Document

Patent Document 1: Japanese Patent Application No. 5390740

SUMMARY

Problem to be Solved by the Invention

In order to cut off the wafer from the ring-shaped projecting portion (reinforcement portion), generally, the wafer is cut with a blade from a front surface side in a state where a front surface of the wafer faces upward. On the front surface of the wafer, a device such as a semiconductor device or the like is formed. Therefore, in the above-described cutting method, there is a problem that cutting chips generated during the cutting of the wafer scatter on the front surface of the wafer, and easily adhere to the device such as the semiconductor device or the like.

Consequently, it is required that the cutting chips are restrained from scattering on the front surface of the wafer. Note that in the related configuration A, this requirement cannot be satisfied.

The present invention is achieved in order to solve the above-described problem, and it is an object of the present invention to provide a semiconductor manufacturing method capable of suppressing scattering of cutting chips on a front surface of a wafer.

Means to Solve the Problem

In order to achieve the above-described object, a semiconductor manufacturing method according to one aspect of the present invention is a manufacturing method using a wafer formed with a ring-shaped projecting portion on a back surface of the wafer. The semiconductor manufacturing method includes a holding step of holding the wafer by supporting the projecting portion of the wafer with the back surface facing upward, and a cutting step of cutting the wafer with a blade from a side of a front surface of the wafer so that the projecting portion is cut off from the wafer.

Effects of the Invention

According to the present invention, the wafer is cut with the blade from the side of the front surface of the wafer in the state where the projecting portion of the wafer with the back surface facing upward is supported. That is, the wafer is cut in a state where the front surface of the wafer faces downward.

Thereby, cutting chips generated during the cutting of the wafer drop downward. Accordingly, scattering of the cutting chips on the front surface of the wafer can be suppressed.

The objects, features, aspects, and advantages of the present invention will become more apparent from the following detailed description and the accompanying drawings.

DESCRIPTION OF EMBODIMENTS

Hereinafter, embodiments of the present invention will be described with reference to the drawings. In the following drawings, the same components are denoted by the same reference signs. Names and functions of the components denoted by the same reference sign are the same. Accordingly, detailed descriptions of a part of the components denoted by the same reference sign may not be repeated.

It should be noted that dimensions, a material, a shape, relative arrangement of each of the components, and the like exemplified in the embodiments may be appropriately changed according to a configuration of a device to which the present invention is applied, various conditions, and the like.

First Embodiment

Figure 1A:
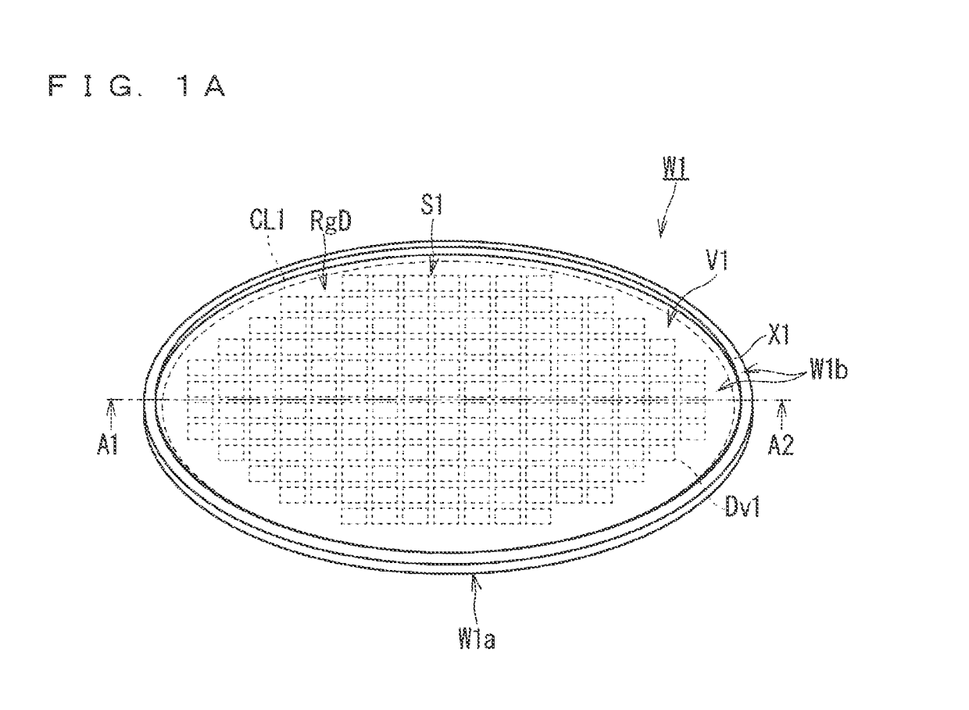
FIGS. 1A and 1B are views showing a configuration of a wafer used in a first embodiment of the present invention.
Figure 1B:
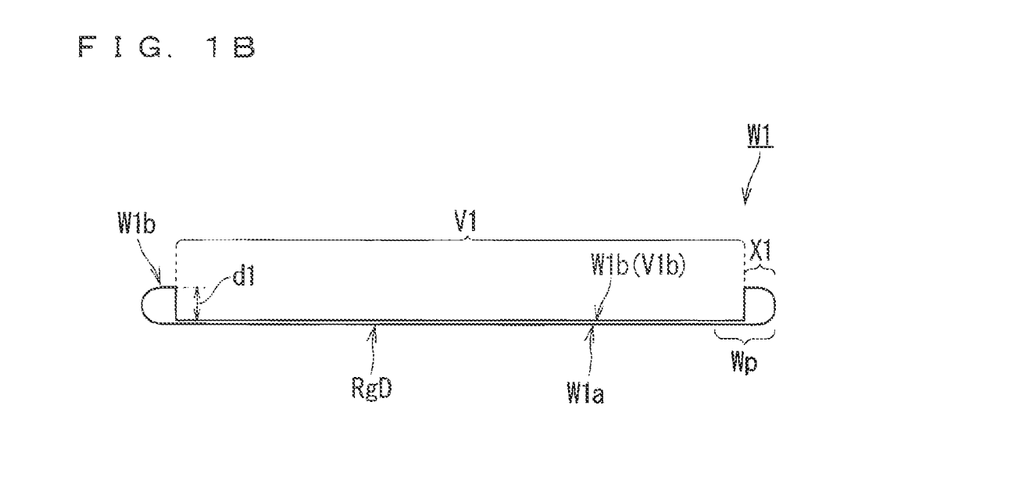

FIGS. 1A and 1B are views showing a configuration of a wafer W1 used in a first embodiment of the present invention. FIG. 1A is a perspective view of the wafer W1. FIG. 1B is a cross-sectional view of the wafer W1 along an A1-A2 line in FIG. 1A.

Referring to FIGS. 1A and 1B, the wafer W1 includes a front surface W1a and a back surface W1b. The front surface W1a is formed with a plurality of semiconductor devices Dv1. Dicing streets S1 are formed among the plurality of semiconductor devices Dv1. In the following description, a region where the plurality of semiconductor devices Dv1 are formed in the wafer W1 is also referred to as a "device region RgD". The device region RgD corresponds to a central portion of the wafer W1.

The back surface W1b is a surface of the wafer W1 on an opposite side of the front surface W1a. In the back surface W1b, a projecting portion X1 is formed. A shape of the projecting portion X1 is a ring shape (closed loop shape)

A shape of the wafer W1 is circular in a plan view. In the following description, a rim portion of the wafer W1 in a plan view is also referred to a "rim portion Wp". A shape of the rim portion Wp in a plan view is a ring shape. The projection portion X1 is formed in the rim portion Wp of the wafer W1. Therefore, the wafer W1 has a disk-shaped recessed portion V1. The recessed portion V1 is a portion inside the ring-shaped projecting portion X1 in the back surface W1b of the wafer W1. In the following description, a bottom surface of the recessed portion V1 is also referred to as a "bottom surface V1b". The bottom surface V1b is a part of the back surface W1b. Moreover, in the following description, a depth of the recessed portion V1 is also referred to as a "depth d1".

Note that in FIG. 1A, a cutting line CL1 is shown. The cutting line CL1 is a line used for cutting off the projecting portion X1 from the wafer W1. Specifically, the cutting line CL1 is a line indicating a position where the wafer W1 is cut with a blade BL1 described later. A shape of the cutting line CL1 is circular. Note that a region surrounded by the cutting line CL1 in the wafer W1 is the device region RgD.

In the following description, a step for removing the projecting portion X1 from the wafer W1 is also referred to as a "semiconductor manufacturing method Pr".

Next, the semiconductor manufacturing method Pr in the present embodiment will be described. The semiconductor manufacturing method Pr is a step included in a manufacturing method for manufacturing the semiconductor devices Dv1. The semiconductor manufacturing method Pr is a manufacturing method using the wafer W1.

Figure 2:
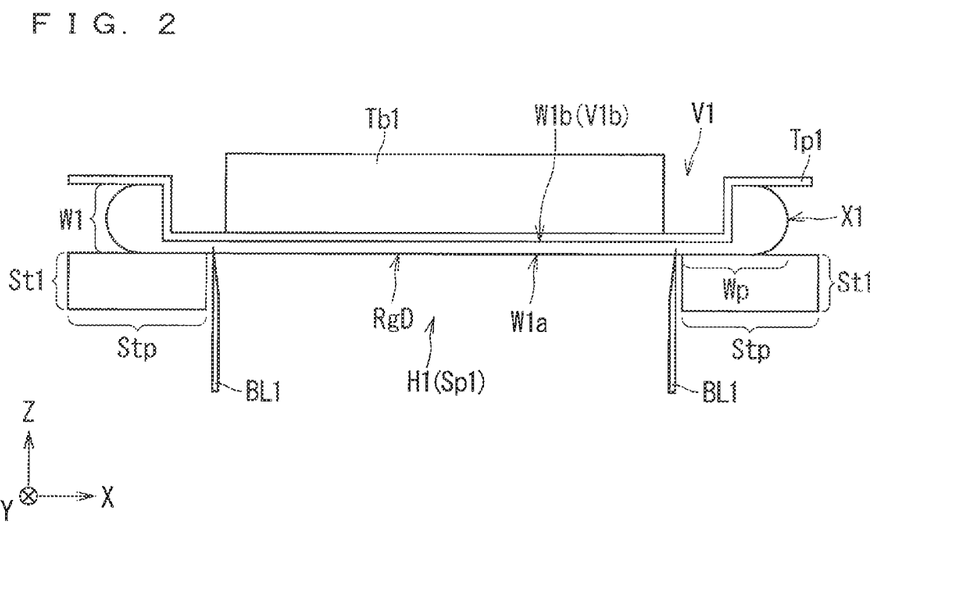
FIG. 2 is a view for describing a semiconductor manufacturing method Pr according to the first embodiment of the present invention.

FIG. 2 is a view for describing the semiconductor manufacturing method Pr according to the first embodiment of the present invention. The semiconductor manufacturing method Pr is performed with a grinding device (not shown). The grinding device includes the blade BL1, a chuck table Tb1, and a stage St1 shown in FIG. 2. The stage St1 is fixed to the grinding device.

Note that in FIG. 2, in order to make it easy to understand the position where the wafer W1 is to be cut, the two blades BL1 are shown. However, actually, the grinding device performs a cutting step described later, using the one blade BL1. Moreover, the grinding device has a function of moving the chuck table Tb1.

In FIG. 2, an X direction, a Y direction, and a Z direction are orthogonal to one another. The X direction, the Y direction, and the Z direction shown in the subsequent figures are also orthogonal to one another. In the following description, a direction including the X direction and a direction opposite to the X direction (-X direction) is also referred to as an "X axis direction". Moreover, in the following description, a direction including the Y direction and a direction opposite to the Y direction (-Y direction) is also referred to as a "Y axis direction". In the following description, a direction including the Z direction and a direction opposite to the Z direction (-Z direction) is also referred to as a "Z axis direction".

In the following description, a plane including the X axis direction and the Y axis direction is also referred to as an "XY plane". In the following description, a plane including the X axis direction and the Z axis direction is also referred to as an "XZ plane". In the following description, a plane including the Y axis direction and the Z axis direction is also referred to as a "YZ plane".

A shape of the chuck table Tb1 is columnar. A size of the chuck table Tb1 in a plan view (XY plane) is smaller than a size of the recessed portion V1 in a plan view (XY plane). The stage St1 is provides with a through hole H1. A shape of the through hole H1 is columnar.

In the following description, a space where the through hole H1 exists is also referred to a "space Sp1". Moreover, in the following description, a portion of the stage St1 in contact with the space Sp1 (through hole H1) is also referred to as a "rim portion Stp". A shape of the rim portion Stp in a plan view (XY plane) is a ring shape. Moreover, in the following description, a device having a function of moving the wafer W1 is also referred to as a "wafer moving device". The wafer moving device has a function of grasping the wafer W1, or the like.

Note that before the semiconductor manufacturing method Pr is performed, a dicing tape Tp1 is beforehand stuck to the whole back surface W1b of the wafer W1. When the semiconductor manufacturing method Pr is performed, the dicing tape Tp1 is stuck to the whole back surface W1b of the wafer W1, as shown in FIG. 2. That is, the relevant dicing tape Tp1 is stuck to the back surface W1b of the wafer W1 so as to cover the projecting portion X1. Moreover, the dicing tape Tp1 is stuck to a bottom surface V1b of the recessed portion V1.

In the following description, a state of the relevant wafer W1 where the dicing tape Tp1 is stuck to the whole hack surface W1b of the wafer W1 is also referred to as a "state with the tape". Note that the dicing tape Tp1 has a property that adhesion of the relevant dicing tape Tp1 decreases when the relevant dicing tape Tp1 is irradiated with ultraviolet rays.

Figure 3:
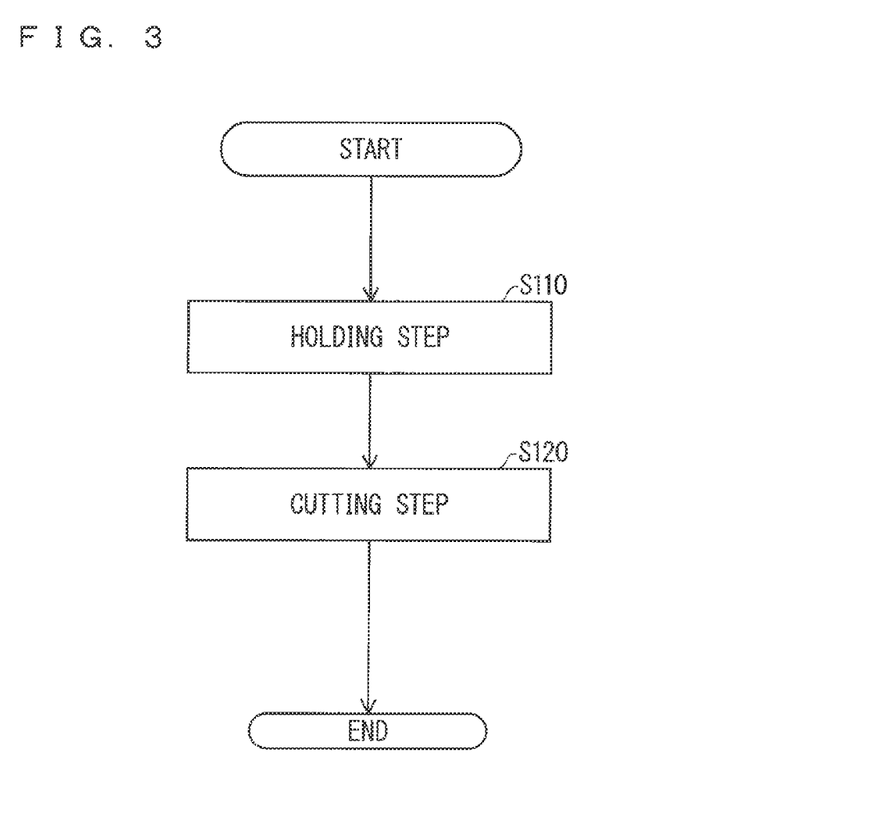
FIG. 3 is a flowchart of the semiconductor manufacturing method Pr according to the first embodiment of the present invention.

FIG. 3 is a flowchart of the semiconductor manufacturing method Pr according to the first embodiment of the present invention. In the semiconductor manufacturing method Pr, first, processing in step S110 is performed.

In step S110, a holding step is performed. In the holding step, the wafer W1 is placed on the rim portion Stp of the stage St1 by the wafer moving device. In the following description, a state of the wafer W1 where the back surface W1b faces upward is also referred to as a "back-surface upward state".

Specifically, in the holding step, the wafer moving device places the rim portion Wp (projecting portion X1) of the wafer W1 on the stage St1 (rim portion Stp) so that the space Sp1 (through hole H1) exists under the central portion of the wafer W1 in the back-surface upward state. That is, the holding step is a step of holding the relevant wafer W1 by the stage St1 (rim portion Stp) supporting the projecting portion X1 of the wafer W1 in the back-surface upward state.

Moreover, in the holding step, after the wafer W1 is placed on the stage St1, the grinding device puts the chuck table Tb1 into an inside of the recessed portion V1 of the wafer W1. This allows the chuck table Tb1 to be in the recessed portion V1 of the wafer W1. The chuck table Tb1 sucks and holds the bottom surface V1b of the wafer W1 through the dicing tape Tp1. Accordingly, the wafer W1 is securely fixed (held) by the stage St1 and the chuck table Tb1. Next, processing in step S120 is performed.

In step S120, the cutting step is performed. The cutting step is a step of cutting the wafer W1 with the blade BL1 of the grinding device. The cutting step is performed in a state where the front surface W1a of the wafer W1 faces downward as shown in FIG. 2.

Specifically, in the cutting step, the grinding device cuts the relevant wafer W1 with the blade BL1 from a front surface W1a side of the wafer W1 so that the projecting portion X1 is cut off from the wafer W1. Note that the grinding device cuts the wafer W1 by moving the blade BL1 along the foregoing cutting line CL1. Thereby, the semiconductor manufacturing method Pr ends.

As described above, according to the present embodiment, the relevant wafer W1 is cut with the blade BL1 from the side of the front surface W1a of the relevant wafer W1 in the state where the projecting portion X1 of the wafer W1 with the back surface W1b facing upward is supported. That is, in the state where the front surface W1a of the wafer W1 faces downward, the wafer W1 is cut.

Thereby, cutting chips generated during the cutting of the wafer drop downward. Accordingly, scattering of the cutting chips on the front surface of the wafer can be suppressed.

Figure 8:
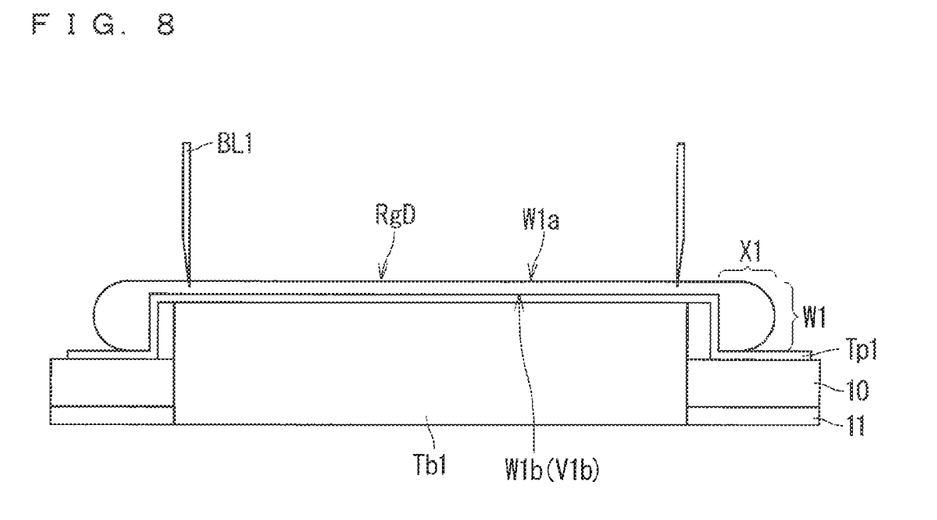
FIG. 8 is a view for describing a semiconductor manufacturing method Prn as a comparative example.

Here, a comparative example to be compared with the present embodiment will be described. In the following description, the semiconductor manufacturing method Pr as the comparative example is also referred to as a "semiconductor manufacturing method Prn". The semiconductor manufacturing method Prn is a manufacturing method to be compared with the semiconductor manufacturing method Pr of the present embodiment. FIG. 8 is a view for describing the semiconductor manufacturing method Pro as the comparative example.

In the semiconductor manufacturing method Prn, as shown in FIG. 8, the front surface W1a of the wafer W1 with the tape faces upward, and the relevant wafer W1 is supported by the chuck table Tb1 and a supporting member 10. Specifically, the chuck table Tb1 supports the bottom surface V1b of the recessed portion V1 of the wafer W1 through the dicing tape Tp1. Moreover, the supporting member 10 holds the relevant projecting portion X1 by supporting the projecting portion X1 of the wafer W1 through the dicing tape Tp1.

A thickness of the projecting portion X1 of the wafer W1 varies for each wafer W1. Moreover, a thickness of the device region RgD of the wafer W1 varies for each type of the semiconductor device Dv1. Therefore, in the semiconductor manufacturing method Prn, a spacer 11 is used to adjust a height of a front surface of the supporting member 10, which supports the projecting portion X1, The spacer 11 is a member conforming to variation in thickness of the projecting portion X1. Therefore, the spacer 11 having a different height is used in accordance with the variation in thickness of the projecting portion X1. Moreover, the spacer 11 is also a member conforming to a step equivalent to a difference between the thickness of the projecting portion X1 and the thickness of the device region RgD in the wafer W1. That is, the spacer 11 is a member conforming to the thickness of the device region RgD and the thickness of the projecting portion X1 in the wafer W1.

In the semiconductor manufacturing method Prn, a cutting step N is performed in the state of FIG. 8. In the cutting step N, the grinding device cuts the relevant wafer W1 with the blade BL1 from the side of the front surface W1a of the wafer W1. Note that if the height of the spacer 11 used in the semiconductor manufacturing method Prn is not proper, the projecting portion X1 is not securely fixed.

If the cutting step N is performed in the state where the projecting portion X1 is not securely fixed, the wafer W1 vibrates and a crack occurs in the relevant wafer "W1. In this case, there is a possibility that a defect occurs in the semiconductor devices Dv1 The relevant defect is, for example, a defect that electric characteristics of the semiconductor devices Dv1 deteriorate.

Therefore, in the semiconductor manufacturing method Prn, since working for exchanging the spacer 11 for each type of the semiconductor devices Dv1 in the wafer W1 is required, there is a problem that working efficiency is poor.

In the semiconductor manufacturing method Prn, the cutting step N is performed in the state of FIG. 8. Therefore, there is a high possibility that the cutting chips generated when the cutting step N is performed adhere to the semiconductor devices Dv1.

On the other hand, in the semiconductor manufacturing method Pr of the present embodiment, as shown in FIG. 2, the wafer W1 in the back-surface upward state is securely fixed (held) by the stage St1 and the chuck table Tb1. This allows the projecting portion X1 to be securely fixed (held) without using the spacer 11 as in the semiconductor manufacturing method Prn.

Moreover, in the semiconductor manufacturing method Pr, the foregoing cutting step is performed in the state where the wafer W1 is securely held. This can prevent the wafer W1 from vibrating when the cutting step is performed. This can prevent a crack from occurring in the wafer W1.

Moreover, in the semiconductor manufacturing method Pr, the spacer 11 is not used, the spacer 11 conforming to the step equivalent to the difference between the thickness of the projecting portion X1 and the thickness of the device region RgD in the wafer W1. Therefore, working for exchanging the spacer 11 for each type of the semiconductor devices Dv1 in the wafer W1 is not required. Accordingly, the working efficiency can be increased.

In the semiconductor manufacturing method Pr, the cutting step is performed in the state of FIG. 2. Therefore, the cutting chips generated when the cutting step is performed drop toward a lower side of the wafer W1. This can restrain the cutting chips from adhering to the semiconductor devices Dv1. Accordingly, occurrence of poor appearance of the semiconductor devices Dv1 can be prevented.

Second Embodiment

A configuration of the present embodiment is a configuration in which in the foregoing semiconductor manufacturing method Pr, a step of using ultraviolet rays is added (hereinafter, also referred to as a "configuration CtA"). In the following description, the semiconductor manufacturing method Pr to which the configuration CtA is applied is also referred to as a "semiconductor manufacturing method Pra".

Figure 4:
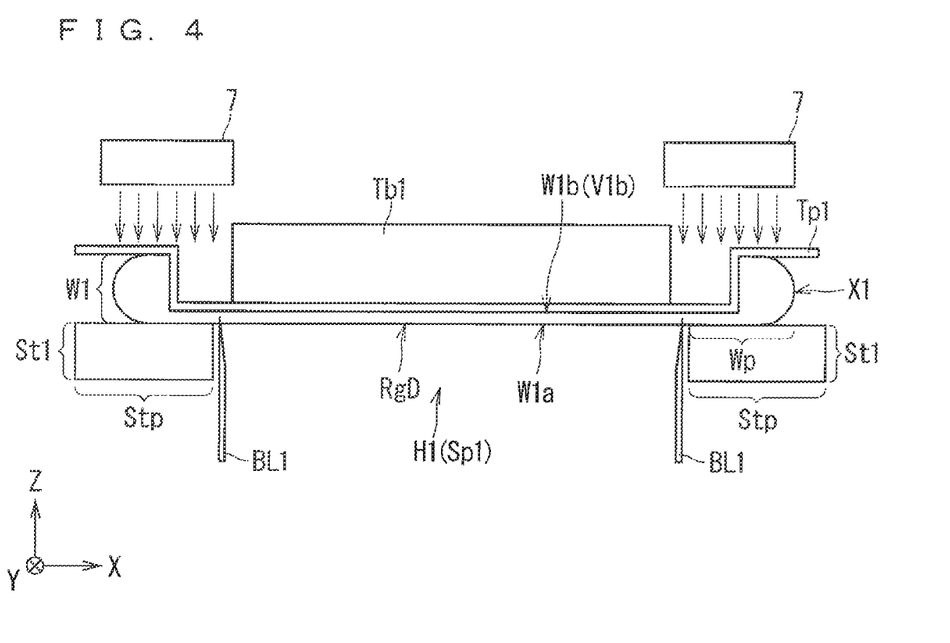
FIG. 4 is a view for describing a semiconductor manufacturing method Pra according to a second embodiment of the present invention.
Figure 5:
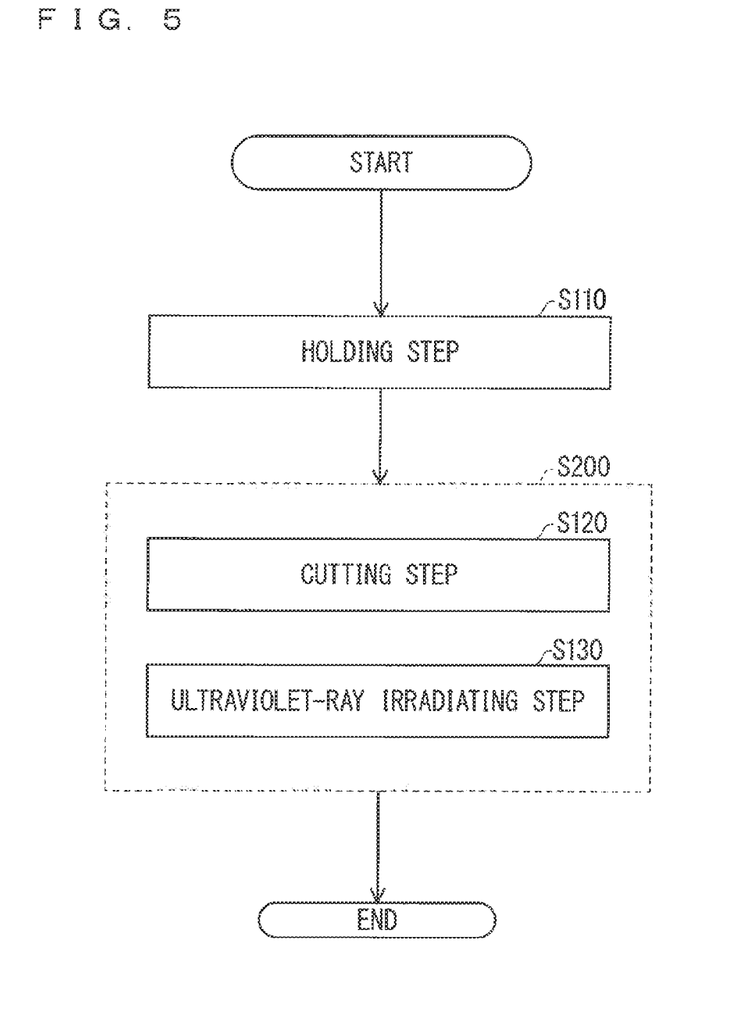
FIG. 5 is a flowchart of the semiconductor manufacturing method Pra according to the second embodiment of the present invention.

FIG. 4 is a view for describing the semiconductor manufacturing method Pra according to a second embodiment of the present invention. FIG. 5 is a flowchart of the semiconductor manufacturing method Pra according to the second embodiment of the present invention. In FIG. 5, processing in the same step number as the step number in FIG. 3 is processing similar to the processing described in the first embodiment, and thus, detailed description will not be repeated. Hereinafter, a description will be given, focusing on different points from the first embodiment.

In the semiconductor manufacturing method Pra, the wafer W1 with the tape is used as in the first embodiment. In the conductor manufacturing method Pra, the holding step in step S110 is performed as in the first embodiment. Thereby, the rim portion Wp (projecting portion X1) of the wafer W1 is placed on the stage St1 (rim portion Stp) so that the space Sp1 exists under the central portion of the wafer W1 in the back-surface upward state After step S110, processing in step S200 is performed. Step S200 includes step S120 and step S130. In step S120, the cutting step is performed as in the first embodiment.

In step S130, an ultraviolet-ray irradiating step is performed. The ultraviolet-ray irradiating step is performed in parallel to the cutting step (S120). Specifically, the cutting step and the ultraviolet-ray irradiating step are performed simultaneously. "Simultaneously" in the present embodiment also includes meaning of "almost simultaneously". In the ultraviolet-ray irradiating step, an ultraviolet-ray irradiating device 7 is used. The ultraviolet-ray irradiating device 7 is a device having a function of irradiating the whole ring-shaped projecting portion X1 with ultraviolet rays.

In the ultraviolet-ray irradiating step, as shown in FIG. 4, the ultraviolet-ray irradiating device 7 irradiates, with the ultraviolet rays, the projecting portion X1 of the wafer W1 with the tape. Specifically, in the ultraviolet-ray irradiating step, the ultraviolet-ray irradiating device 7 irradiates the whole ring-shaped projecting portion X1 with the ultraviolet rays from an upper side of the ring-shaped projecting portion X1.

Since this allows the dicing tape Tp1 to be irradiated with the ultraviolet rays, adhesion of the relevant dicing tape Tp1 decreases. Accordingly, processing for peeling the dicing tape Tp1 off from the projecting portion X1 is easily performed, and at the foregoing, the semiconductor manufacturing method Prn ends.

As described above, according to the present embodiment, the cutting step and the ultraviolet-ray irradiating step are simultaneously performed. Therefore, the processing for peeling the dicing tape Tp1 off from the projecting portion X1 can be easily performed, and the projecting portion X1 is cut off from the wafer W1. Accordingly, time required for completing the manufacturing of the semiconductor devices Dv1 can be shortened. As a result, productivity of the semiconductor devices Dv1 can be enhanced.

Third Embodiment

A configuration of the present embodiment is a configuration in which in the foregoing semiconductor manufacturing method Pr, a chuck table having a larger size is used (hereinafter, also referred to as a "configuration CtB"). In the following description, the semiconductor manufacturing method Pr to which the configuration CtB is applied is also referred to as a "semiconductor manufacturing method Prb".

Figure 6:
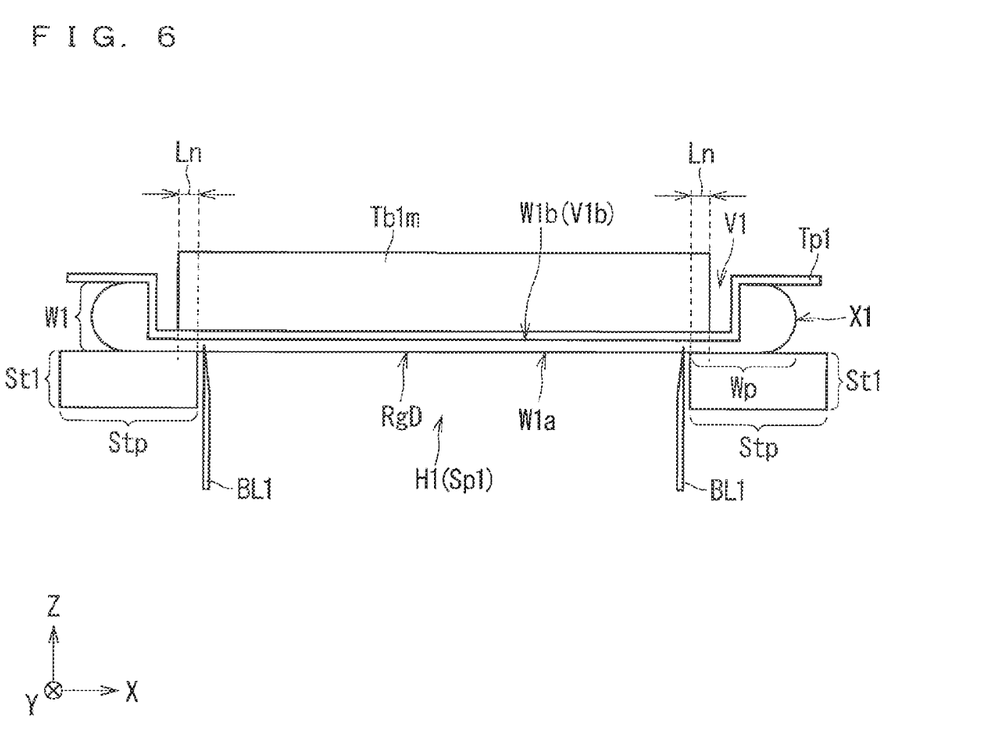
FIG. 6 is a view for describing a semiconductor manufacturing method Prb according to a third embodiment of the present invention.
Figure 7:
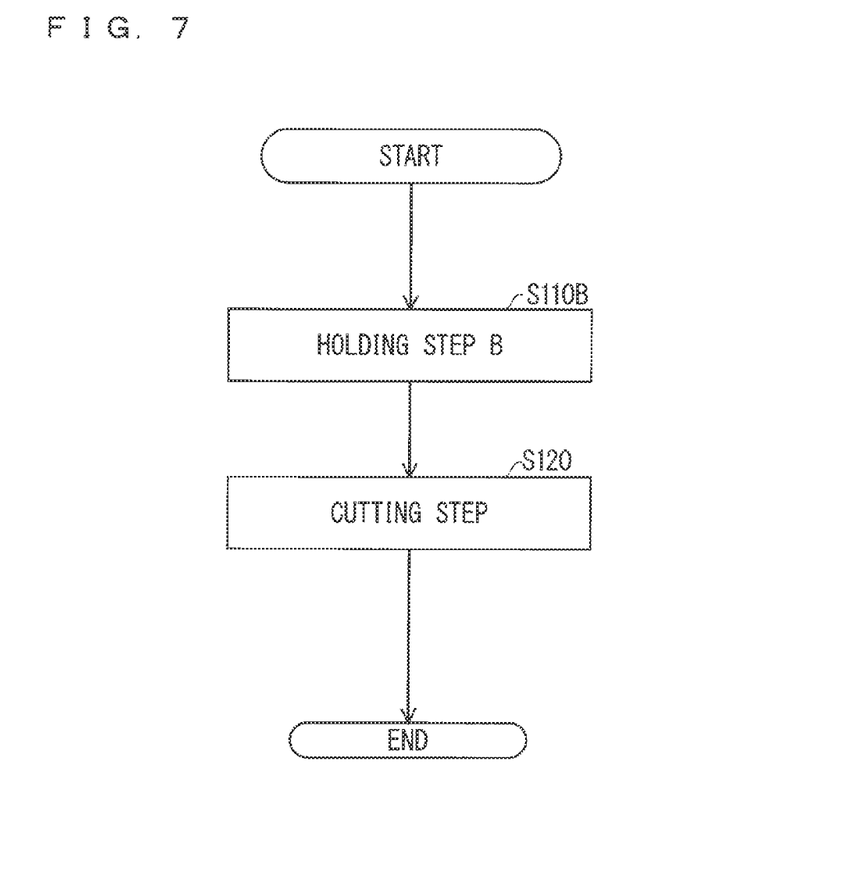
FIG. 7 is a flowchart of the semiconductor manufacturing method Prb according to the third embodiment of the present invention.

FIG. 6 is a view for describing the semiconductor manufacturing method Prb according to a third embodiment of the present invention. FIG. 7 is a flowchart of the semiconductor manufacturing method Prb according to the third embodiment of the present invention. In FIG. 7, processing in the same step number as the step number in FIG. 3 is processing similar to the processing described in the first embodiment, and thus, detailed description will not be repeated. Hereinafter, a description will be given, focusing on different points from the first embodiment.

In the semiconductor manufacturing method. Prb, first, processing in step S110B is performed. In step S110B, a holding step B is performed. In the holding step B, a chuck table Tb1m is used.

A shape of the chuck table Tb1m is columnar. A size of the chuck table Tb1m in a plan view (XY plane) is smaller than the size of the recessed portion V1 in a plan view (XY plane). Moreover, a volume of the chuck table Tb1m is larger than a volume of the chuck table Tb1 in FIG. 2. Specifically, a diameter of the chuck table Tb1m in a plan view (XY plane) is larger than a diameter of the chuck table Tb1 in a plan view (XY plane).

In the holding step B, the wafer moving device places the rim portion Wp (projecting portion X1) of the wafer W1 on the stage St1 (rim portion Stp) so that the space Sp1 exists under the central portion of the wafer W1 in the back-surface upward state.

Moreover, in the holding step B, after the wafer W1 is placed on the stage St1, the grinding device puts the chuck table Tb1m into the inside of the recessed portion V1 of the wafer W1. Specifically, the grinding device puts the chuck table Tb1m into the inside of the recessed portion V1 so that a rim portion of the chuck table Tb1m overlaps the rim portion Stp of the stage St1 only by a length Ln in a plan view (XY plane).

After the holding step B is performed, the cutting step (S120) is performed as in the first embodiment. Therefore, when the cutting step (S120) is performed, the rim portion Wp (projecting portion X1) of the wafer W1 is placed on the stage St1 (rim portion Stp) so that the space Sp1 exists under the central portion of the wafer W1 in the back-surface upward state.

Moreover, when the cutting step is performed, the chuck table Tb1m is in the recessed portion V1 of the wafer W1. Moreover, when the cutting step is performed, the rim portion of the chuck table Tb1m overlaps the rim portion Stp of the stage St1 in a plan view (XY plane). This allows the wafer W1 to be securely fixed by the stage St1 and the chuck table Tb1m in a state where the front surface W1a of the wafer W1 is parallel to an upper surface of the stage St1.

The cutting step (S120) is performed in the state where the wafer W1 is securely fixed. This can prevent the wafer W1 from vibrating when the wafer W1 is cut. Accordingly, a crack can be prevented from occurring in the wafer W1.

In the present invention, within the scope of the invention, each of the embodiments can be freely combined, or each of the embodiments can be appropriately modified or omitted.

Although the present invention has been described in detail, the above description is illustrative in all aspects, and the present invention is not limited thereto, it is understood that innumerable modifications not illustrated can be envisaged without departing from the scope of the present invention.

EXPLANATION OF REFERENCE SIGNS

BL1 blade
Tb1, Tb1m chuck table
Tp1 dicing tape
W1 wafer
X1 projecting portion

The invention claimed is:
1. A semiconductor manufacturing method using a wafer formed with a ring-shaped projecting portion in a back surface of the wafer, the method comprising:

a holding step of holding the wafer by supporting the ring-shaped projecting portion of the wafer with the back surface facing upward; and a cutting step of cutting the wafer with a blade from a side of a front surface of the wafer so that the ring-shaped projecting portion is cut off from the wafer, wherein the back surface is a surface of the wafer on an opposite side of the front surface, the wafer includes a recessed portion, a bottom surface of the recessed portion is part of the back surface of the wafer, a chuck table is put into the recessed portion of the wafer when the cutting step is performed, the bottom surface of the recessed portion is located above the front surface of the wafer when the cutting step is performed, and when the cutting step is performed,
- a stage for supporting the wafer is in direct contact with the front surface of the wafer, and
- the blade cuts the wafer from the side of the front surface of the wafer that the stage is in contact with.

2. The semiconductor manufacturing method according to claim 1, wherein a dicing tape is stuck to the back surface of the wafer so that the dicing tape covers the ring-shaped projecting portion, the semiconductor manufacturing method further comprising:

an ultraviolet-ray irradiating step performed in parallel to the cutting step, and in the ultraviolet-ray irradiating step, the ring-shaped projecting portion is irradiated with ultraviolet rays.

3. The semiconductor manufacturing method according to claim 1, wherein the ring-shaped projecting portion is formed in a rim portion of the wafer, when the cutting step is performed,
- (a1) the rim portion of the wafer is placed on the stage so that a space exists under a central portion of the wafer with the back surface facing upward,
- (a2) the chuck table is put into the recessed portion, which is an inner portion of the ring-shaped projecting portion, in the back surface of the wafer, and
- (a3) a rim portion of the chuck table overlaps a portion in contact with the space of the stage in a plan view.

* * * * *